US012627319B2

(12) United States Patent
Nakahashi

(10) Patent No.: US 12,627,319 B2
(45) Date of Patent: May 12, 2026

(54) MULTIPLEXER

(71) Applicant: Murata Manufacturing Co., Ltd., Nagaokakyo (JP)

(72) Inventor: Norihiko Nakahashi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 329 days.

(21) Appl. No.: 18/416,975

(22) Filed: Jan. 19, 2024

(65) Prior Publication Data

US 2024/0250700 A1      Jul. 25, 2024

(30) Foreign Application Priority Data

Jan. 24, 2023     (JP) ................................. 2023-008582

(51) Int. Cl.
| | |
|---|---|
| *H04B 1/00* | (2006.01) |
| *H03H 9/02* | (2006.01) |
| *H03H 9/25* | (2006.01) |
| *H03H 9/64* | (2006.01) |

(52) U.S. Cl.
CPC ............. *H04B 1/0057* (2013.01); *H03H 9/02* (2013.01); *H03H 9/25* (2013.01); *H03H 9/64* (2013.01)

(58) Field of Classification Search
CPC .......... H04B 1/0057; H03H 9/02; H03H 9/25; H03H 9/64
See application file for complete search history.

(56) References Cited

U.S. PATENT DOCUMENTS

| | | | | |
|---|---|---|---|---|
| 2011/0199160 A1* | 8/2011 | Yamanaka | ......... | H03H 9/02661 |
| | | | | 331/155 |
| 2012/0274417 A1* | 11/2012 | Kihara | ..................... | H03H 7/38 |
| | | | | 333/133 |
| 2015/0288346 A1* | 10/2015 | Nakamura | ........... | H03H 9/1452 |
| | | | | 310/365 |
| 2016/0204762 A1* | 7/2016 | Lee | ....................... | H03H 9/1078 |
| | | | | 310/313 C |
| 2018/0131349 A1 | 5/2018 | Takata | | |
| 2020/0328728 A1* | 10/2020 | Nakagawa | ........... | H04B 1/0057 |
| 2020/0358424 A1* | 11/2020 | Kaneda | .................... | H03H 9/25 |
| 2021/0044271 A1* | 2/2021 | Takata | ............... | H03H 9/02574 |

FOREIGN PATENT DOCUMENTS

| | | |
|---|---|---|
| JP | 2018-074539 A | 5/2018 |

* cited by examiner

*Primary Examiner* — David Bilodeau
(74) *Attorney, Agent, or Firm* — Keating & Bennett, LLP

(57) ABSTRACT

A multiplexer includes a common terminal, first and second input/output terminals, a filter connected between the common terminal and the first input/output terminals and having a pass band including a first frequency band, a filter that is connected between the common terminal and the second input/output terminal and having a pass band including a second frequency band lower than the first frequency band, and an additional circuit including a first end connected to the common terminal and a second end connected to portion of a path connecting the common terminal and the first input/output terminal, the portion excluding the common terminal. The additional circuit includes a resonator including IDT electrodes on a piezoelectric substrate, and the IDT electrode with a widest electrode finger pitch is connected to the common terminal.

20 Claims, 9 Drawing Sheets

N2→N1

MULTIPLEXER

CROSS REFERENCE TO RELATED APPLICATIONS

This application claims the benefit of priority to Japanese Patent Application No. 2023-008582 filed on Jan. 24, 2023. The entire contents of this application are hereby incorporated herein by reference.

BACKGROUND OF THE INVENTION

1. Field of the Invention

The present invention relates to a multiplexer.

2. Description of the Related Art

Japanese Unexamined Patent Application Publication No. 2018-74539 discloses the circuit configuration of a multiplexer including a transmission-side filter (first filter) using a first frequency band as a pass band and a reception-side filter (second filter) using a second frequency band as a pass band. An additional circuit including a resonator including a plurality of IDT electrodes is connected to an input/output terminal of the first filter. The connection of the additional circuit enables an attenuation characteristic in a predetermined frequency band for the first filter to be improved.

SUMMARY OF THE INVENTION

However, the multiplexer described in Japanese Unexamined Patent Application Publication No. 2018-74539 has an issue of bandpass characteristic deterioration in the second filter due to a design parameter for the plurality of IDT electrodes included in the additional circuit.

Example embodiments of the present invention provide multiplexers that each achieve an improved bandpass characteristic.

According to an aspect of an example embodiment of the present invention, a multiplexer includes a common terminal, a first input/output terminal, a second input/output terminal, a first filter circuit connected between the common terminal and the first input/output terminal and having a pass band including a first frequency band, a second filter circuit connected between the common terminal and the second input/output terminal and having a pass band including a second frequency band lower than the first frequency band, and an additional circuit including a first end connected to the common terminal and a second end connected to a portion of a path connecting the common terminal and the first input/output terminal, the portion excluding the common terminal. The additional circuit includes a resonator including a plurality of interdigital transducer electrodes on a piezoelectric substrate. An interdigital transducer electrode of the plurality of interdigital transducer electrodes that has a widest electrode finger pitch is connected to the common terminal.

According to example embodiments of the present invention, multiplexers each having an improved bandpass characteristic are provided.

The above and other elements, features, steps, characteristics and advantages of the present invention will become more apparent from the following detailed description of the example embodiments with reference to the attached drawings.

DESCRIPTION OF THE PREFERRED EXAMPLE EMBODIMENTS

Figure 1:
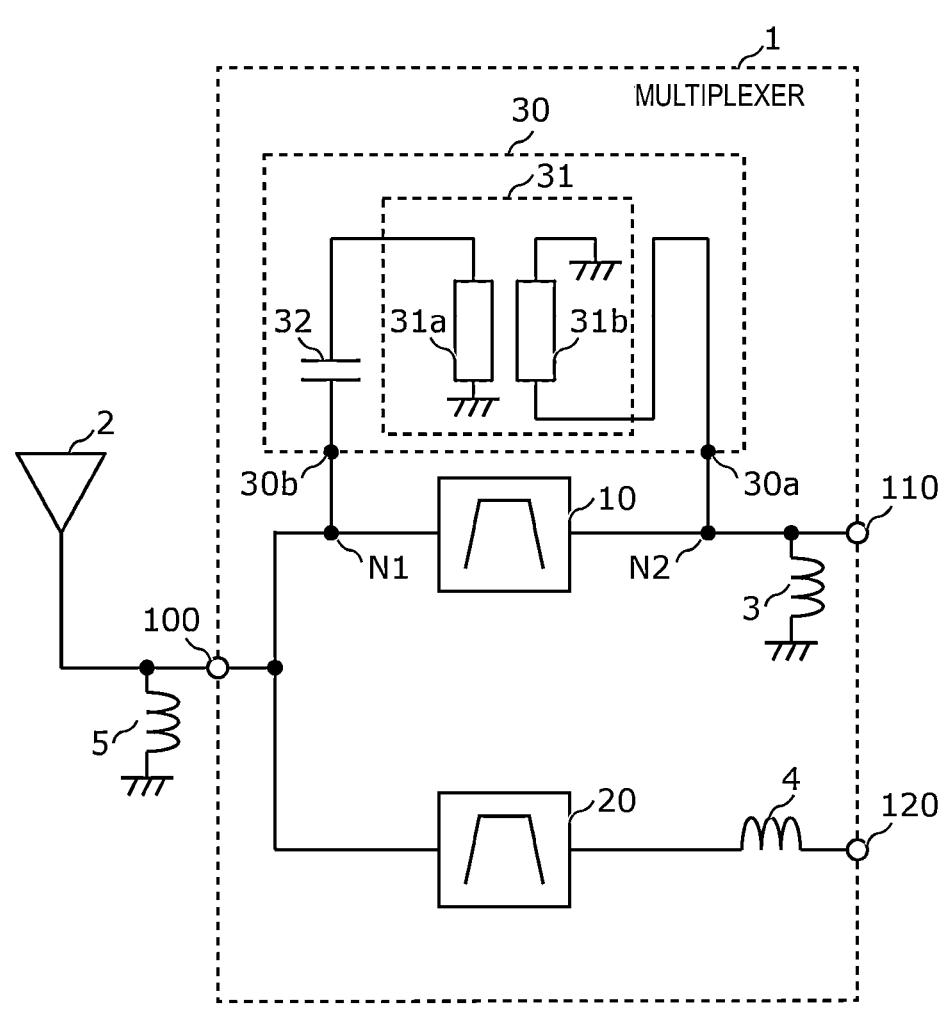
FIG. 1 is a view of a circuit configuration of a multiplexer according to an example embodiment of the present invention and a peripheral circuit of the multiplexer.

Hereinafter, example embodiments of the present disclosure will be described in detail by using the drawings. The example embodiments to be described later are merely comprehensive or specific examples. Accordingly, a numerical value, a shape, a material, a component, the arrangement of the component and the like described in the following example embodiments are merely examples and are not intended to limit the present invention.

Each drawing is a schematic view appropriately subjected to emphasis, omission, or ratio control to describe example embodiments of the present invention, is not necessarily strictly illustrated, and has a shape, a positional relationship and a ratio different from actual ones on occasions. Substantially the same components are denoted by the same reference numerals throughout the drawings and redundancy is omitted or simplified in some cases.

In the circuit configuration of the present disclosure, the phrase "connected between A and B" denotes being connected to both of A and B between A and B.

In the component layout in the present disclosure, the phrase "a component A is disposed in series to a path B" denotes that a signal input terminal and a signal output terminal of the component A are both connected to a wiring line, an electrode, or a terminal included in the path B.

The terms "parallel", "perpendicular", and the like representing a relationship between elements, a term representing the shape of an element such as the term "rectangular", and a numerical value range indicate not only strict meaning but also inclusion of substantially the same range, for example, an error of approximately several percent.

Example Embodiment

1. Circuit Configuration of Multiplexer

FIG. 1 is a view of the circuit configuration of a multiplexer 1 according to an example embodiment and a peripheral circuit of the multiplexer 1. FIG. 1 illustrates the multiplexer 1 according to this example embodiment, an antenna 2, and an inductor 5.

The multiplexer 1 includes a filter 10, a filter 20, an additional circuit 30, inductors 3 and 4, a common terminal 100, an input/output terminal 110 (a first input/output terminal), and an input/output terminal 120 (a second input/output terminal).

The filter 10 is an example of a first filter circuit, is connected between the common terminal 100 and the input/output terminal 110, and has a pass band including a first frequency band.

The filter 20 is an example of a second filter circuit, is connected between the common terminal 100 and the input/output terminal 120, and has a pass band including a second frequency band lower than the first frequency band.

The inductor 3 is an impedance matching element connected between the input/output terminal 110 and the ground. The inductor 4 is an impedance matching element connected in series to a path connecting the input/output terminal 120 and the filter 20. The inductor 3 may be connected in series to a path connecting the input/output terminal 110 and the filter 10. The inductor 4 may be connected between the input/output terminal 120 and the ground. In addition, the inductors 3 and 4 do not have to be provided.

The additional circuit 30 includes an input terminal 30a (second end) and an output terminal 30b (first end). The output terminal 30b is connected to a node N1, and the input terminal 30a is connected to a node N2. The node N1 is a connecting point on a path connecting the common terminal 100 and the filter 10, and the node N2 is a connecting point on the path connecting the input/output terminal 110 and the filter 10. The input terminal 30a of the additional circuit 30 may be connected to a portion of a path connecting the common terminal 100 and the input/output terminal 110, the portion excluding the common terminal 100. The node N1 and the node N2 are two different nodes. The term "two different nodes" denotes that the two nodes are connected to each other with an impedance element (such as an inductor, a capacitor, a resistor, or a resonator) interposed therebetween.

The additional circuit 30 includes a resonator including a plurality of I electrodes on the piezoelectric substrate. Specifically, the additional circuit 30 includes a longitudinally coupled resonator 31 and a capacitor 32. The longitudinally coupled resonator 31 includes surface acoustic wave resonators 31a and 31b. One end (surface acoustic wave resonator 31a) of the longitudinally coupled resonator 31 is connected to the capacitor 32, and the other end (surface acoustic wave resonator 31b) is connected to the node N2 with the input terminal 30a interposed therebetween. The capacitor 32 is connected between the surface acoustic wave resonator 31a and the node N1.

The surface acoustic wave resonators 31a and 31b include the piezoelectric substrate and the respective IDT electrodes on the substrate. The IDT electrode of the surface acoustic wave resonator 31a includes two comb-shaped electrodes facing each other. One of the comb-shaped electrodes is connected to the capacitor 32, and the other comb-shaped electrode is connected to the ground. The IDT electrode of the surface acoustic wave resonator 31b includes two comb-shaped electrodes facing each other. One of the comb-shaped electrodes is connected to the input terminal 30a, and the other comb-shaped electrode is connected to the ground. The IDT electrode of the surface acoustic wave resonator 31a and the IDT electrode of the surface acoustic wave resonator 31b are parallel to each other in an acoustic wave propagation direction.

Reflectors may be disposed on both sides of the longitudinally coupled resonator 31 in the acoustic wave propagation direction.

The additional circuit 30 may include a transversal acoustic wave resonator to transmit a signal by using propagation of an surface acoustic wave between two or more IDT electrodes, instead of the surface acoustic wave resonators 31a and 31b.

With the configuration described above, the additional circuit 30 generates a component with substantially the same amplitude as and in a substantially opposite phase from a component in a predetermined frequency band higher than or lower than the first frequency band for passing through the filter 10. The attenuation characteristic of the filter 10 in the predetermined frequency band may thereby be improved.

The IDT electrode having the widest electrode finger pitch (e.g., about $\frac{1}{2}$ of a wavelength $\lambda$) of the plurality of IDT electrodes of the additional circuit 30 is connected to the node N1 (common terminal 100).

At the frequency at which the insertion loss of the additional circuit 30 is minimum, a return loss in a view from the node N1 (common terminal 100) to the additional circuit 30 is lower than a return loss in a view from the node N2 to the additional circuit 30. Since the adjacent loss to the filter 20 is thus reduced, the insertion loss deterioration in the filter 20 may be reduced. The multiplexer 1 including the filters 10 and 20 having an improved bandpass characteristic may thus be provided.

The longitudinally coupled resonator 31 may have a configuration in which three or more acoustic wave resonators are disposed in parallel in the acoustic wave propagation direction.

In addition, the capacitor 32 does not have to be provided, and one end of the surface acoustic wave resonator 31a may be directly connected to the node N1. The capacitor may also be connected between one end of the surface acoustic wave resonator 31b and the node N2.

2. Example of Multiplexer 1 According to Example Embodiment

The multiplexer 1 according to an example of an example embodiment will then be described. The multiplexer 1 according to this example has the same configuration as that illustrated in FIG. 1 and includes the filter 10, the filter 20, the additional circuit 30, the inductors 3 and 4, the common terminal 100, and the input/output terminals 110 and 120.

A specific circuit configuration example of the filters 10 and 20 is illustrated for the multiplexer 1 according to this example as compared with the multiplexer 1 according to the above-described example embodiment.

Figure 2A:
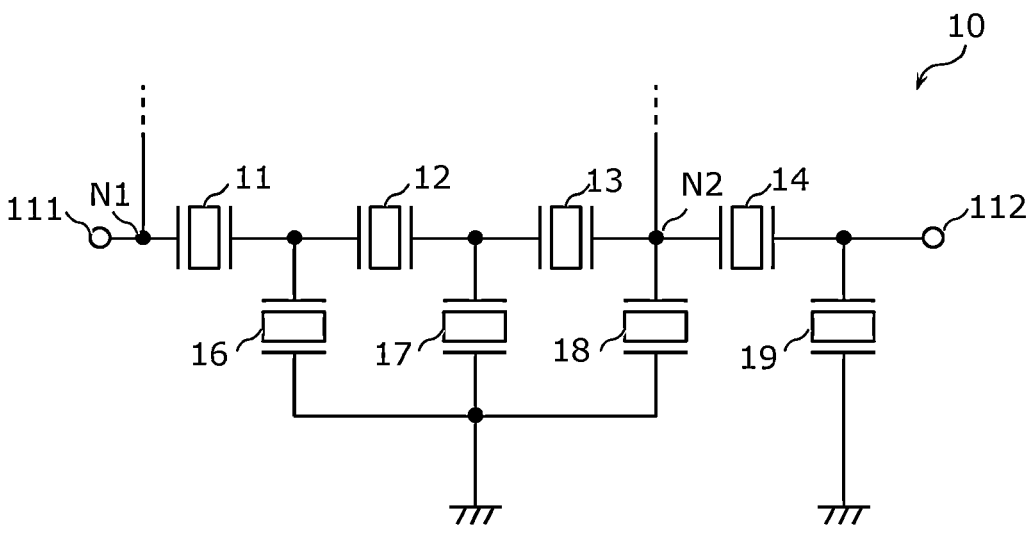
FIG. 2A is a view of a circuit configuration of a first filter circuit according to an example embodiment of the present invention.

FIG. 2A is a view of the circuit configuration of the filter 10 according to this example of an example embodiment.

The filter 10 is an example of the first filter circuit and is a ladder acoustic wave filter circuit including a plurality of acoustic wave resonators. The filter 10 includes serial arm resonators 11, 12, 13, and 14 and parallel arm resonators 16, 17, 18, and 19. The serial arm resonators 11 to 14 are located on a serial arm path connecting a terminal 111 and a terminal 112. The terminal 111 is connected to the common terminal 100, and the terminal 112 is connected to the input/output terminal 110. Each of the parallel arm resonators 16 to 19 is connected between the serial arm path described above and the ground. Each of the serial arm resonators 11 to 14 and the parallel arm resonators 16 to 19 is a surface acoustic wave resonator that includes, for example, a Y-cut LiNbO$_3$ piezoelectric substrate and an IDT electrode on the piezoelectric substrate and that uses a Rayleigh wave.

With the configuration described above, the filter 10 uses, as the pass band (first frequency band), an uplink operation band (e.g., about 663 MHz to about 698 MHz) of, for example, the band B71 for Long Term Evolution (LTE) or the band n71 for 5th Generation (5G)—New Radio (NR).

In this example of an example embodiment, the output terminal 30b of the additional circuit 30 is connected to the node N1, and the input terminal 30a of the additional circuit 30 is connected to the node N2 between the serial arm resonator 13 and the serial arm resonator 14.

A circuit configuration of a first filter circuit according to example embodiments of the present invention is not limited to the circuit configuration of the filter 10 illustrated in FIG. 2A.

Figure 2B:
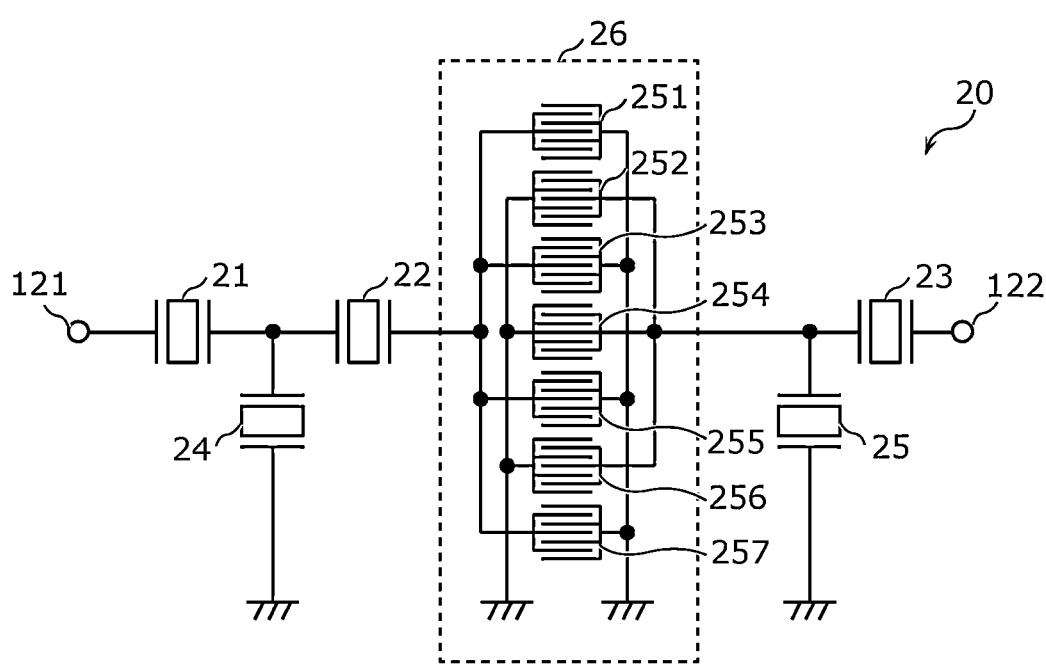
FIG. 2B is a view of a circuit configuration of a second filter circuit according to an example embodiment of the present invention.

FIG. 2B is a view of the circuit configuration of the filter 20 according to the example of the example embodiment.

The filter 20 is an example of the second filter circuit and is an acoustic wave filter circuit including a longitudinally coupled resonator 26 including seven acoustic wave resonators, for example. The filter 20 includes the longitudinally coupled resonator 26, serial arm resonators 21, 22, and 23, and parallel arm resonators 24 and 25.

The longitudinally coupled resonator 26 includes surface acoustic wave resonators 251, 252, 253, 254, 255, 256, and 257. One end of the longitudinally coupled resonator 26 is connected to a terminal 121 with the serial arm resonators 21 and 22 interposed therebetween, and the other end thereof is connected to a terminal 122 with the serial arm resonator 23 interposed therebetween. The terminal 121 is connected to the common terminal 100, and the terminal 122 is connected to the input/output terminal 120.

The surface acoustic wave resonators 251 to 257 includes the piezoelectric substrate and respective IDT electrodes on the substrate. Each IDT electrode of a corresponding one of the surface acoustic wave resonators 251 to 257 includes two comb-shaped electrodes facing each other. One of the comb-shaped electrodes of each of the surface acoustic wave resonators 251, 253, 255, and 257 is connected to the terminal 121 with the serial arm resonators 21 and 22 interposed therebetween, and the other comb-shaped electrode of each of the surface acoustic wave resonators 251, 253, 255, and 257 is connected to the ground. One of the comb-shaped electrodes of each of the surface acoustic wave resonators 252, 254, and 256 is connected to the terminal 122 with the serial arm resonator 23 interposed therebetween, and the other comb-shaped electrode of each of the surface acoustic wave resonators 252, 254, and 256 is connected to the ground. The surface acoustic wave resonators 251 to 257 are disposed in the order of the surface acoustic wave resonators 251, 252, 253, 254, 255, 256, and 257 in the acoustic wave propagation direction.

The serial arm resonators 21, 22, and 23 are located on a serial arm path connecting the terminals 121 and 122. Each of the parallel arm resonators 24 and 25 is connected between the serial arm path and the ground.

Each of the surface acoustic wave resonators 251 to 257, the serial arm resonators 21 to 23, and the parallel arm resonators 24 and 25 is a surface acoustic wave resonator that includes, for example, a Y-cut LiNbO$_3$ piezoelectric substrate and the IDT electrode on the piezoelectric substrate and that uses a Rayleigh wave.

With the configuration described above, the filter 20 uses, as a pass band (second frequency band), a downlink operation band (e.g., about 617 MHz to about 652 MHz) of, for example, the band B71 for LTE or the band n71 for 5G-NR.

A circuit configuration of a second filter circuit according to example embodiments of the present invention is not limited to the circuit configuration of the filter 20 illustrated in FIG. 2B.

In the multiplexer 1 according to this example of an example embodiment, the pass band of the filter 10 is higher than the pass band of the filter 20. However, the band applied to the filters 10 and 20 is not limited to the band B71 for LTE and the band n71 for 5G-NR.

If the filters 10 and 20 are a surface acoustic wave filter, the piezoelectric substrate is a Y-cut LiNbO$_3$ piezoelectric substrate and does not have to be a substrate that uses a Rayleigh wave. The piezoelectric substrate may be, for example, a LiTaO$_3$ piezoelectric substrate that uses a Leaky wave.

The piezoelectric substrate may also have a structure in which a high-acoustic-velocity support substrate, a low-acoustic-velocity film, and a piezoelectric film are stacked in this order and may also have a structure in which a support substrate, an energy confinement layer, and a piezoelectric film are stacked in this order.

In this example of an example embodiment, the filter 10 is not limited to the ladder surface acoustic wave filter and may be a surface acoustic wave filter other than the ladder surface acoustic wave filter. Further, the filter 10 may include an inductor and a capacitor. The filter 20 is not limited to the longitudinally coupled surface acoustic wave filter. The filter 20 may have a structure other than the longitudinally coupled structure and may also be a bulk acoustic wave filter. Further, the filter 20 may also be an LC filter including an inductor and a capacitor.

The number of acoustic wave resonators included in the longitudinally coupled resonator 31 of the additional circuit 30 may be 3 or more, for example.

3. Structure of Acoustic Wave Filter

The structure of each of the acoustic wave resonators of the filters 10 and 20 and the additional circuit 30 included in the multiplexer 1 will be illustrated.

Figure 3A:
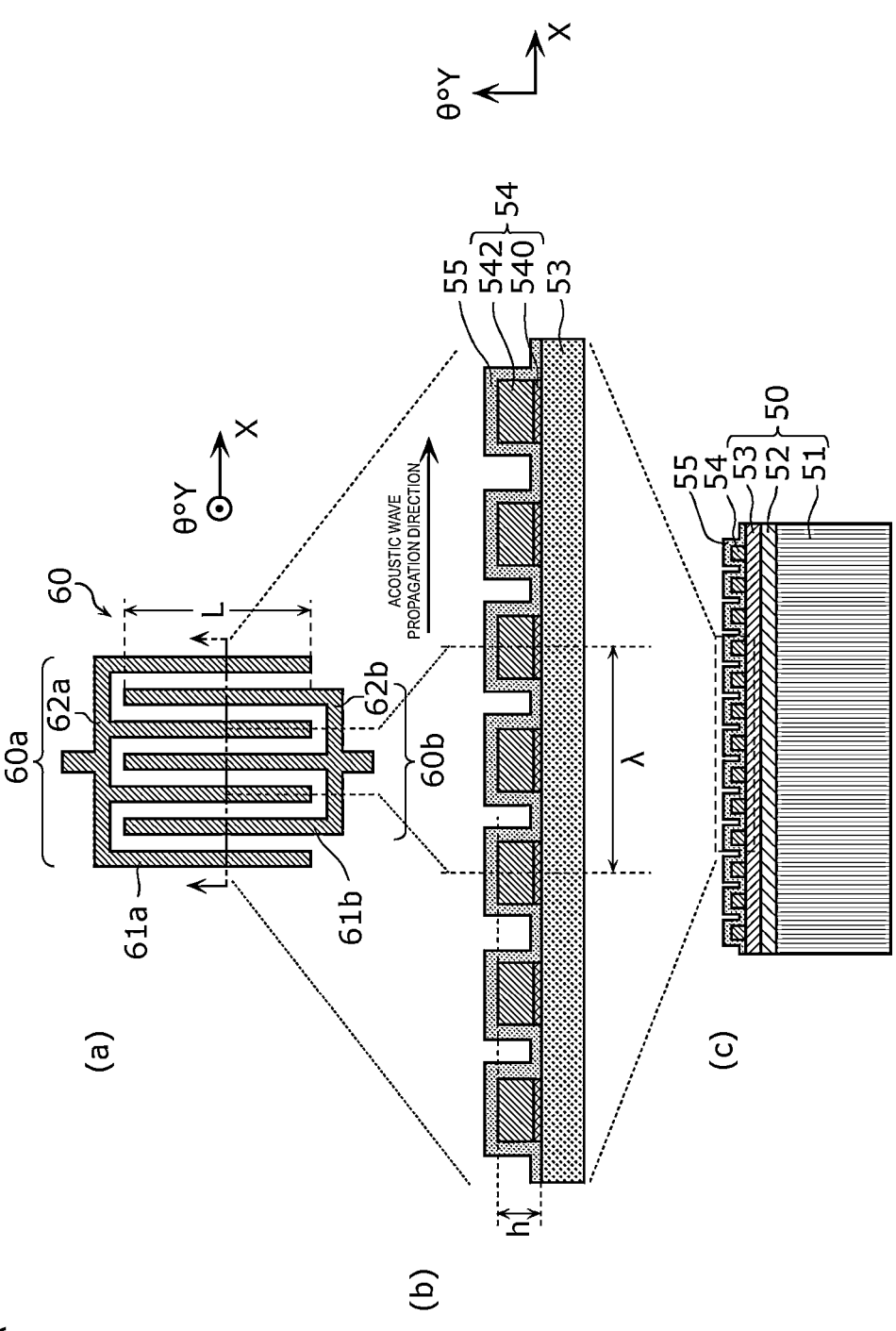
FIG. 3A illustrates a plan view and a cross-sectional view schematically illustrating a first example of an acoustic wave resonator included in each of filters and an additional circuit according to an example embodiment of the present invention.

FIG. 3A illustrates a plan view and a cross-sectional view schematically illustrating a first example of the acoustic wave resonator of each of the filters 10 and 20 and the additional circuit 30 according to an example of an example embodiment. FIG. 3A illustrates the basic structure of the acoustic wave resonator included in the filters 10 and 20 and the additional circuit 30. A surface acoustic wave resonator 60 illustrated in FIG. 3A is provided to explain the typical structure of the acoustic wave resonator, and the number of electrode fingers included in the electrode, the length thereof, and the like are not limited to those in this structure.

The surface acoustic wave resonator 60 includes a piezoelectric substrate 50 and comb-shaped electrodes 60a and 60b.

As illustrated in (a) in FIG. 3A, the pair of comb-shaped electrodes 60a and 60b facing each other are provided on the substrate 50. The comb-shaped electrode 60a includes a plurality of electrode fingers 61a parallel to each other and a busbar electrode 62a connecting the plurality of electrode fingers 61a. The comb-shaped electrode 60b includes a plurality of electrode finger 61b parallel to each other and a busbar electrode 62b connecting the plurality of electrode fingers 61b. The plurality of electrode fingers 61a and 61b are provided in a direction orthogonal to the acoustic wave propagation direction (an X-axis direction).

An IDT electrode 54 including the plurality of electrode fingers 61a and 61b and the busbar electrodes 62a and 62b has a structure in which a close-contact layer 540 and a main electrode layer 542 are laminated as illustrated in (b) in FIG. 3A.

The close-contact layer 540 is provided to improve close contact between the substrate 50 and the main electrode layer 542, and for example, Ti is used as a material thereof. As a material of the main electrode layer 542, for example, Al containing 1% Cu is used. A protection layer 55 is formed in such a manner as to cover the comb-shaped electrodes 60a and 60b. The protection layer 55 is provided to protect the main electrode layer 542 from an external environment, control a frequency temperature characteristic, increase anti-humidity, and the like and is a dielectric film having, for example, silicon dioxide as a main component.

The materials of the close-contact layer 540, the main electrode layer 542, and the protection layer 55 are not limited to the materials described above. Further, the IDT electrode 54 does not have to have the layered structure above. The IDT electrode 54 may be made of a metal such as Ti, Al, Cu, Pt, Au, Ag, or Pd, or an alloy thereof and may also be including a plurality of multilayer bodies made of the metal or the alloy above. The protection layer 55 does not have to be formed.

The layered structure of the substrate 50 will then be described.

As illustrated in (c) in FIG. 3A, the substrate 50 includes a high-acoustic-velocity support substrate 51, a low-acoustic-velocity film 52, and a piezoelectric film 53 and has a structure in which the high-acoustic-velocity support substrate 51, the low-acoustic-velocity film 52, and the piezoelectric film 53 are stacked in this order.

The piezoelectric film 53 is made of, for example, a θ° Y-cut X-propagating LiTaO₃ piezoelectric single crystal or a piezoelectric ceramic (a lithium tantalite single crystal or a ceramic that is cut along a plane with a normal line serving as an axis rotated by θ° from a Y axis with respect to an X axis serving as the center axis and in which a surface acoustic wave propagates in the X-axis direction). The material and the cut angle θ of the piezoelectric single crystal used as the piezoelectric film 53 are appropriately selected in accordance with the required specifications of the filters.

The high-acoustic-velocity support substrate 51 is a substrate that supports the low-acoustic-velocity film 52, the piezoelectric film 53, and the IDT electrode 54. Further, the high-acoustic-velocity support substrate 51 is a substrate in which the acoustic velocity of a bulk wave in the high-acoustic-velocity support substrate 51 is higher than that of an acoustic wave such as the surface acoustic wave propagating in the piezoelectric film 53 or the boundary acoustic wave. The high-acoustic-velocity support substrate 51 confines the surface acoustic wave in a portion where the piezoelectric film 53 and the low-acoustic-velocity film 52 are laminated and functions to prevent the surface acoustic wave from leaking to a portion lower than the high-acoustic-velocity support substrate 51. The high-acoustic-velocity support substrate 51 is, for example, a silicon substrate.

The low-acoustic-velocity film 52 is a film in which the acoustic velocity of a bulk wave in the low-acoustic-velocity film 52 is lower than that of a bulk wave propagating in the piezoelectric film 53 and is disposed between the piezoelectric film 53 and the high-acoustic-velocity support substrate 51. This structure and the property of energy concentration on a medium essentially having a low-velocity acoustic wave prevent the surface acoustic wave energy from leaking to the outside of an IDT electrode. The low-acoustic-velocity film 52 is a film made of, for example, silicon dioxide as a main component.

The layered structure described above of the substrate 50 enables a Q value in the resonant frequency and the anti-resonant frequency to be made higher considerably than that in a structure in which a single layer piezoelectric substrate is used. That is, an acoustic wave resonator having a high Q value may be provided, and thus a filter having a low insertion loss may be provided by using the acoustic wave resonator.

The high-acoustic-velocity support substrate 51 may have a structure in which the support substrate and a high-acoustic-velocity film are laminated, the high-acoustic-velocity film having a higher acoustic velocity of the propagating bulk wave than the acoustic velocity of an acoustic wave such as a surface acoustic wave propagating in the piezoelectric film 53 or the boundary acoustic wave. In this case, for the support substrate, piezoelectric bodies such as sapphire, lithium tantalate, lithium niobate, and crystal, various ceramics such as alumina, magnesia, silicon nitride, aluminum nitride, silicon carbide, zirconia, cordierite, mullite, steatite, and forsterite, a dielectric such as glass, semiconductors such as silicon and gallium nitride, a resin substrate, and the like may be used. For the high-acoustic-velocity film, various high-acoustic-velocity materials such as aluminum nitride, aluminum oxide, silicon carbide, silicon nitride, silicon oxynitride, a diamondlike carbon (DLC) film, diamond, a medium having any of these materials as a main component, and a medium having a mixture of any of these materials as a main component may be used.

Figure 3B:
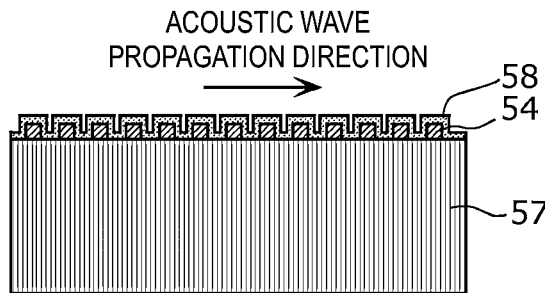
FIG. 3B is a cross-sectional view schematically illustrating a second example of an acoustic wave resonator included in each of filters and an additional circuit according to an example embodiment of the present invention.

FIG. 3B is a cross-sectional view schematically illustrating a second example of the acoustic wave resonator of each of the filters 10 and 20 and the additional circuit 30 according to an example embodiment. For the surface acoustic wave resonator 60 illustrated in FIG. 3A, the example in which the IDT electrode 54 is provided on the substrate 50 including the piezoelectric film 53. However, as illustrated in FIG. 3B, the substrate on which the IDT electrode 54 is provided may be a single crystal piezoelectric substrate 57 including a piezoelectric layer as a single layer. The single crystal piezoelectric substrate 57 is made of, for example, a LiNbO₃ piezoelectric single crystal. The acoustic wave resonator according to this example includes the single crystal piezoelectric substrate 57 made of LiNbO₃, the IDT electrode 54, and a protection layer 58 on the single crystal piezoelectric substrate 57 and the IDT electrode 54.

For the piezoelectric film 53 and the single crystal piezoelectric substrate 57 described above, a layered structure, a material, cut angles, and a thickness may be appropriately changed in accordance with the required bandpass characteristic or the like of an acoustic wave filter device. Even an acoustic wave resonator using the $LiTaO_3$ piezoelectric substrate or the like having cut angles other than the cut angles described above may exert the same advantageous effects as those of the surface acoustic wave resonator 60 using the piezoelectric film 53 described above.

The substrate including the IDT electrode 54 thereon may have a structure in which a support substrate, an energy confinement layer, and a piezoelectric film are stacked in this order. The IDT electrode 54 is provided on the piezoelectric film. For the piezoelectric film, for example, a $LiTaO_3$ piezoelectric single crystal or a piezoelectric ceramic may be used. The support substrate is a substrate that supports the piezoelectric film, the energy confinement layer, and the IDT electrode 54.

The energy confinement layer includes one or more layers, and the velocity of a bulk acoustic wave propagating in at least one of the layers is higher than the velocity of an acoustic wave propagating near the piezoelectric film. For example, the energy confinement layer may have a layered structure having a low acoustic-velocity layer and a high-acoustic-velocity layer. The low acoustic-velocity layer is a film in which the acoustic velocity of the acoustic wave propagating in the piezoelectric film is lower than the acoustic velocity of a bulk wave in the low acoustic-velocity layer. The high-acoustic-velocity layer is a film in which the acoustic velocity of a bulk wave in the high-acoustic-velocity layer is higher than the acoustic velocity of the acoustic wave propagating in the piezoelectric film. The support substrate may be used as the high-acoustic-velocity layer.

The energy confinement layer may also be an acoustic impedance layer having a structure in which a low acoustic-impedance layer having lower acoustic impedance and a high-acoustic-impedance layer having higher acoustic impedance are alternately stacked.

An example of electrode parameters of the IDT electrode included in the surface acoustic wave resonator 60 is described.

The wavelength of an acoustic wave resonator is defined by the wavelength $\lambda$ that is the repetition period of the electrode fingers 61a or 61b included in the IDT electrode 54 illustrated in (b) in FIG. 3A. An electrode finger pitch is about ½ of the wavelength A, for example. In a case where the line width of the electrode fingers 61a and 61b included in each of the comb-shaped electrodes 60a and 60b is W, and the width of a space between the electrode finger 61a and the electrode finger 61b adjacent to each other is S, the electrode finger pitch is defined as (W+S). An intersecting width L of the pair of comb-shaped electrodes 60a and 60b is a length of overlapping electrode fingers of the electrode finger 61a and the electrode finger 61b in a view in the acoustic wave propagation direction (X-axis direction), as illustrated in (a) in FIG. 3A. In a case where the total number of electrode fingers of the electrode fingers 61a and 61b is Ni, the number of pairs in the IDT electrode 54 is defined as (Ni−1)/2, for example. The electrode duty of each acoustic wave resonator is the line width share of the electrode fingers 61a and 61b, thus is a ratio of the line width of the electrode fingers 61a and 61b to a value obtained by adding the line width to the space width, and thus is defined as W/(W+S). The height of the comb-shaped electrodes 60a and 60b is h. Hereinafter, parameters for the shape of an IDT electrode of the acoustic wave resonator such as the wavelength A, the electrode finger pitch, the intersecting width L, the electrode duty, and the height h of the IDT electrode 54 are defined as electrode parameters.

If a distance between adjacent electrode fingers is not fixed in the IDT electrode 54, the electrode finger pitch of the IDT electrode 54 is defined by the average electrode finger pitch of the IDT electrode 54. In a case where the total number of electrode fingers of the electrode fingers 61a and 61b included in the IDT electrode 54 is Ni, a distance between respective centers of the electrode finger located on one end, of the IDT electrode 54, in the acoustic wave propagation direction and the electrode finger located on the other end is Di, the average electrode finger pitch of the IDT electrode 54 is defined as Di/(Ni−1).

Figure 3C:
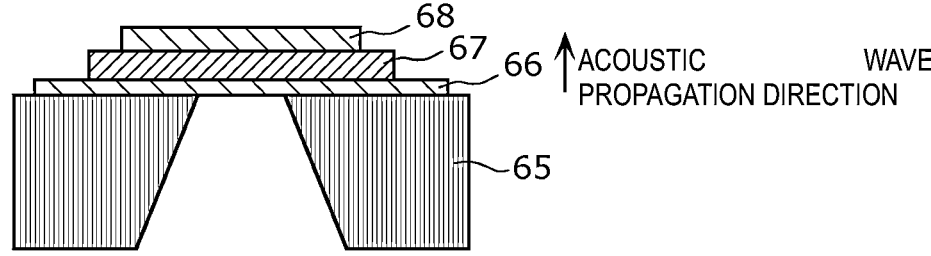
FIG. 3C is a cross-sectional view schematically illustrating a third example of an acoustic wave resonator included in each filter according to an example embodiment of the present invention.

FIG. 3C is a cross-sectional view schematically illustrating a third example of the acoustic wave resonator of each of the filters 10 and 20 according to an example of an example embodiment. FIG. 3C illustrates a bulk acoustic wave resonator as the acoustic wave resonator of each of the filters 10 and 20. As illustrated in FIG. 3C, the bulk acoustic wave resonator has, for example, a support substrate 65, a lower electrode 66, a piezoelectric layer 67, and an upper electrode 68 and has a structure in which the support substrate 65, the lower electrode 66, the piezoelectric layer 67, and the upper electrode 68 are stacked in this order.

The support substrate 65 supports the lower electrode 66, the piezoelectric layer 67, and the upper electrode 68 and is, for example, a silicon substrate. The support substrate 65 includes a hollow portion in a portion of area in contact with the lower electrode 66. This enables the piezoelectric layer 67 to vibrate freely.

The lower electrode 66 is provided on one side surface of the support substrate 65. The upper electrode 68 is provided on the one side surface of the support substrate 65. For the lower electrode 66 and the upper electrode 68, for example, Al containing 1% Cu is used as a material.

The piezoelectric layer 67 is provided between the lower electrode 66 and the upper electrode 68. The piezoelectric layer 67 includes as a main component, at least one of, for example, zinc oxide (ZnO), aluminum nitride (AlN), lead zirconate titanate (PZT), potassium niobate (KN), lithium niobate (LN), lithium tantalate (LT), crystal, and lithium borate (LiBO).

The bulk acoustic wave resonator having the laminated structure described above generates a bulk acoustic wave in the piezoelectric layer 67 by applying electrical energy between the lower electrode 66 and the upper electrode 68 and thus generates resonance. The bulk acoustic wave generated by this bulk acoustic wave resonator propagates in a portion between the lower electrode 66 and the upper electrode 68 in a direction perpendicular to the film surface of the piezoelectric layer 67. That is, the bulk acoustic wave resonator is a resonator using the bulk acoustic wave.

4. Reflection Characteristic of Additional Circuit 30 and Pass Band Characteristic of Multiplexer 1

Table 1 represents electrode parameters for the additional circuit 30 of multiplexers according to examples of example embodiments.

TABLE 1

| | IDT electrode in surface acoustic wave resonator 31a (connected to node N1) | IDT electrode in surface acoustic wave resonator 31b (connected to node N2) |
|---|---|---|
| wavelength λ (μm) | 5.033 | 4.908 |
| the number of pairs | 4 | 4 |
| Duty | 0.60 | 0.60 |
| intersecting width (μm) | 100 | 100 |

As illustrated in Table 1, the wavelength λ of the IDT electrode of the surface acoustic wave resonator 31a is longer than the wavelength λ of the IDT electrode of the surface acoustic wave resonator 31b. In other words, the electrode finger pitch of the surface acoustic wave resonator 31a connected to the node N1 (common terminal 100) is wider than the electrode finger pitch of the IDT electrode of the surface acoustic wave resonator 31b connected to the node N2.

Figure 4A:
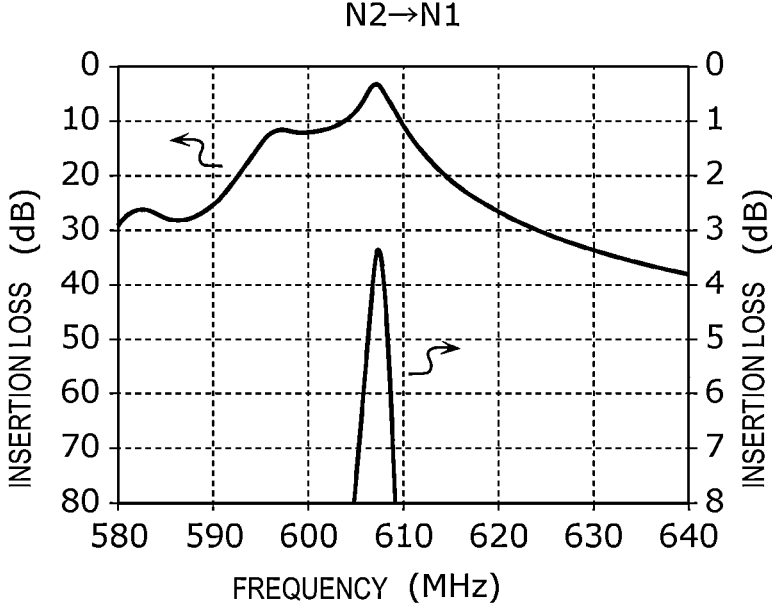
FIG. 4A is a graph illustrating bandpass characteristics of an additional circuit according to an example embodiment of the present invention.

FIG. 4A is a graph illustrating bandpass characteristics of the additional circuit 30 according to an example of an example embodiment. FIG. 4A illustrates a bandpass characteristic of the additional circuit 30 alone from the node N2 to the node N1. In the additional circuit 30, the amplitude level and the phase level of a component near the pass band of the filter 20 (second frequency band) are set to suppress the component in the filter 10. In this example of an example embodiment, a frequency that is lower than the pass band of the filter 10 (near the second frequency band) and at which the insertion loss is minimum is about 608 MHz, for example.

Figure 4B:
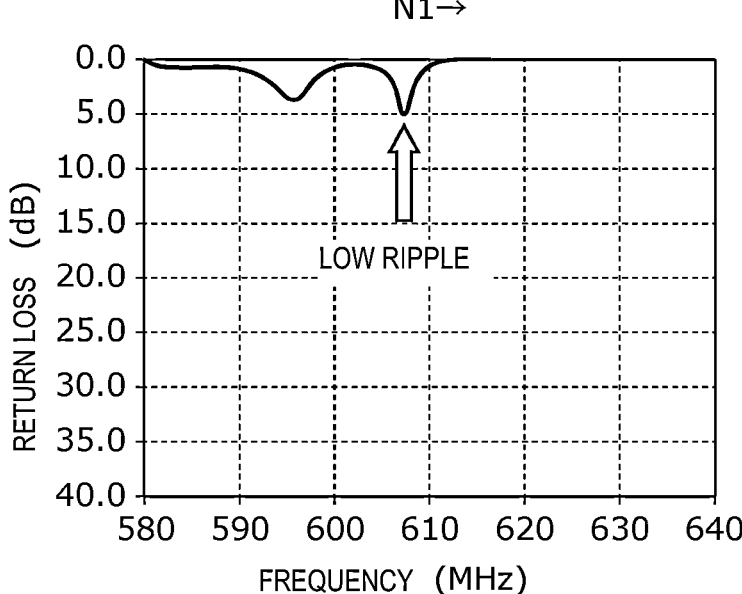
FIG. 4B is a graph illustrating a reflection characteristic in a view from a node N1 to an additional circuit according to an example embodiment of the present invention.
Figure 4C:
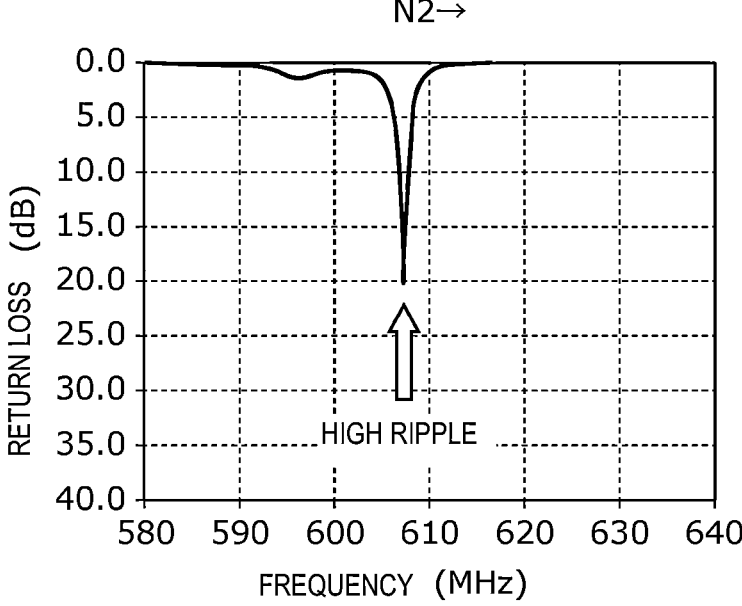
FIG. 4C is a graph illustrating a reflection characteristic in a view from a node N2 to an additional circuit according to an example embodiment of the present invention.

FIG. 4B is a graph illustrating a reflection characteristic in the view from the node N1 to the additional circuit 30 according to an example of an example embodiment. FIG. 4C is a graph illustrating a reflection characteristic in the view from the node N2 to the additional circuit 30 according to the example of an example embodiment. In comparison between the respective reflection characteristics in FIGS. 4B and 4C, near the frequency at which the insertion loss of the additional circuit 30 is minimum (e.g., about 608 MHZ), (the ripple of) a return loss in the view from the node N1 (common terminal 100) to the additional circuit 30 is lower than (the ripple of) a return loss in the view from the node N2 to the additional circuit 30.

Figure 5A:
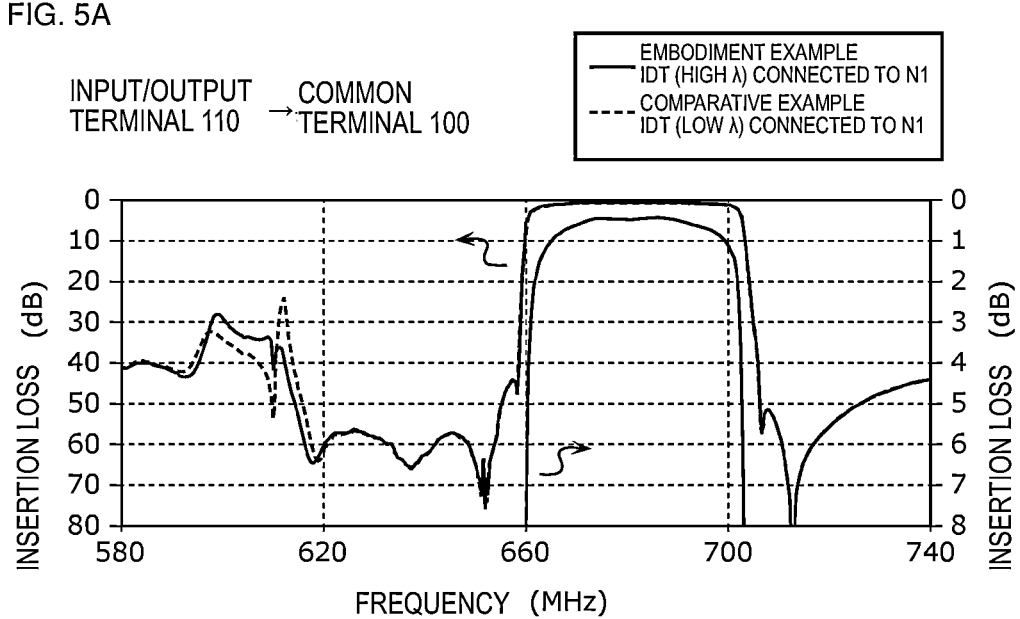
FIG. 5A is a graph illustrating a bandpass characteristic of a first filter circuit and an additional circuit according to an example embodiment of the present invention and a bandpass characteristic of a first filter circuit and an additional circuit according to a comparative example.

FIG. 5A is a graph illustrating a bandpass characteristic of the filter 10 and the additional circuit according to an example of an example embodiment and a bandpass characteristic of the filter 10 and an additional circuit according to a comparative example. FIG. 5A illustrates each bandpass characteristic between the input/output terminal 110 and the common terminal 100 in a state where corresponding ones of the filters 10 and 20, and the additional circuit are connected to the common terminal 100.

Figure 5B:
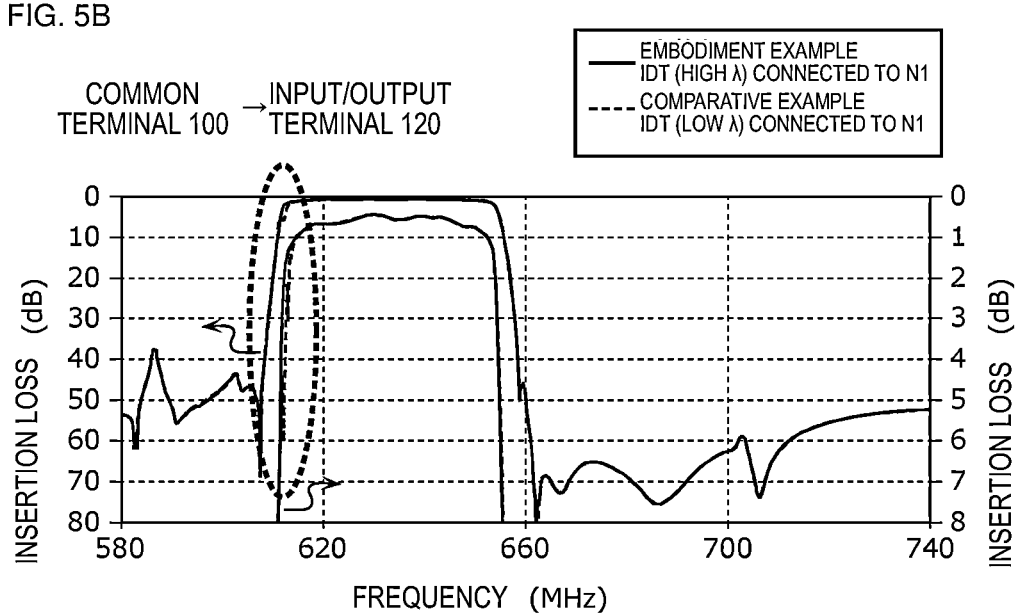
FIG. 5B is a graph illustrating respective bandpass characteristics of second filter circuits according to an example embodiment of the present invention and a comparative example.

FIG. 5B is a graph illustrating respective bandpass characteristics of the filters 20 according to the example of an example embodiment and the comparative example. FIG. 5B illustrates each bandpass characteristic between the input/output terminal 120 and the common terminal 100 in the state where corresponding ones of the filters 10 and 20, the additional circuit, and the additional circuit are connected to the common terminal 100.

Figure 5C:
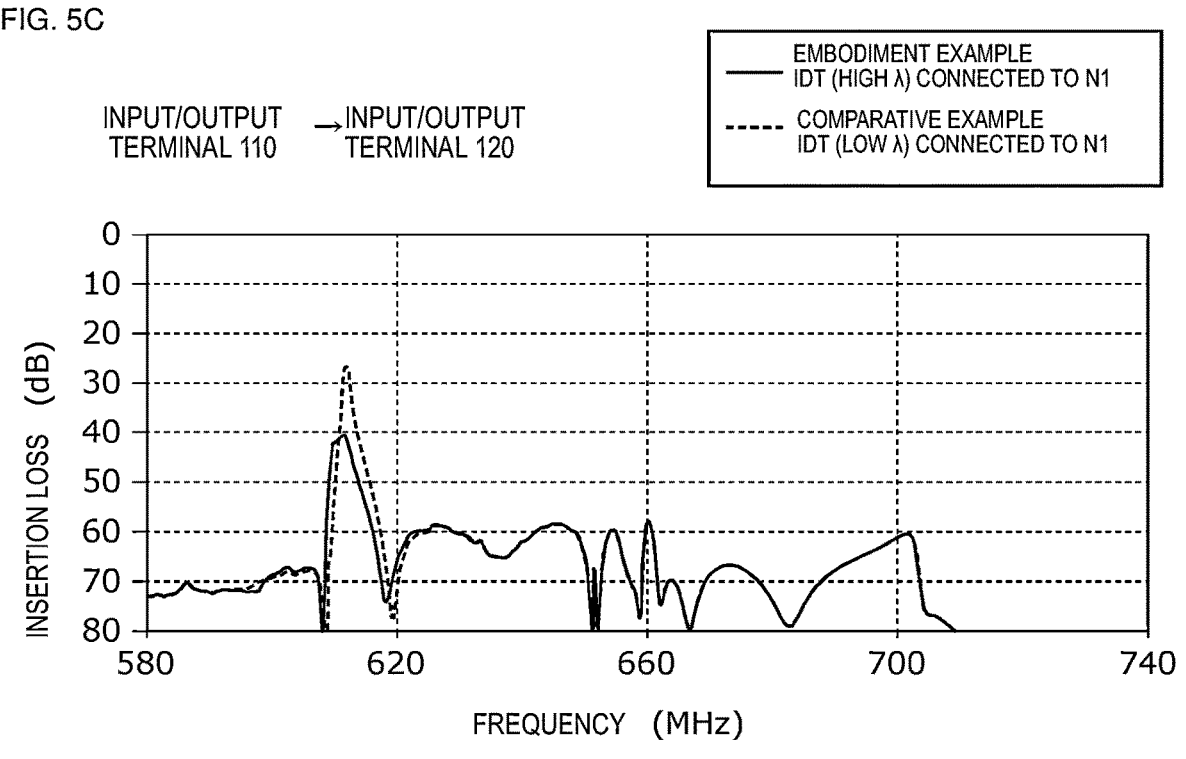
FIG. 5O is a graph illustrating an isolation characteristic of first and second filter circuits according to an example embodiment of the present invention and an isolation characteristic of first and second filter circuits according to a comparative example.

FIG. 5C is a graph illustrating an isolation characteristic of the filters 10 and 20 according to the example of an example embodiment and an isolation characteristic of the filters 10 and 20 according to the comparative example. FIG. 5C illustrates each bandpass characteristic between the input/output terminal 110 and input/output terminal 120 in the state where corresponding ones of the filters 10 and 20, the additional circuit, and the additional circuit are connected to the common terminal 100.

The filter 10 according to the comparative example has the same circuit configuration as that of the filter 10 according to the example of an example embodiment, and the filter 20 according to the comparative example has the same circuit configuration as that of the filter 20 according to the example of an example embodiment. In contrast, the additional circuit according to the comparative example is different from the additional circuit 30 according to the example of an example embodiment in that the surface acoustic wave resonator 31b and the surface acoustic wave resonator 31a are respectively connected to the node N1 and the node N2. That is, in the additional circuit according to the comparative example, the electrode finger pitch of the acoustic wave resonator connected to the node N1 (common terminal 100) is narrower than the electrode finger pitch of the IDT electrode of the acoustic wave resonator connected to the node N2.

As illustrated in FIG. 5B, in frequencies lower than the pass band of the filter 20 (the broken line circle in FIG. 5B), the filter 20 according to the example of an example embodiment has lower insertion loss than the filter 20 according to the comparative example. In other words, the filter 20 according to the example of an example embodiment has a wider pass band width than the filter 20 according to the comparative example.

This is because in the additional circuit 30 according to the example of an example embodiment, near the frequency at which the insertion loss of the additional circuit 30 is minimum (e.g., about 608 MHz), the return loss in the view from the node N1 (common terminal 100) to the additional circuit 30 is lower than the return loss in the view from the node N2 to the additional circuit 30. This enables a signal near the frequency at which the insertion loss is minimum (e.g., about 608 MHz) to be prevented from leaking to the additional circuit 30 when the signal is input from the common terminal 100 to the filter 20. That is, the adjacent loss to the filter 20 is reduced. An increase of the insertion loss of the filter 20 may thus be reduced.

As illustrated in FIG. 5A, the bandpass characteristic of the filter 10 and the additional circuit in the example of an example embodiment is equal to or higher than the bandpass characteristic in the comparative example. In addition, as illustrated in FIG. 5C, the isolation characteristic of the filters 10 and 20 in the example of an example embodiment is equal to or higher than the isolation characteristic in the comparative example.

As described above, in the additional circuit 30, the electrode finger pitch of the acoustic wave resonator connected to the node N1 (common terminal 100) is made wider than the electrode finger pitch of the IDT electrode of the acoustic wave resonator connected to the node N2, and thereby the multiplexer 1 having the improved bandpass characteristic may be provided.

In the additional circuit 30 according to the example of an example embodiment, the smallest value of the electrode finger pitch of the IDT electrode of the acoustic wave resonator connected to the node N1 (common terminal 100) is desirably larger than the smallest value of the electrode finger pitches of the IDT electrodes included in the IDT electrodes and excluding the IDT electrode connected to the node N1 (common terminal 100).

Near the frequency at which the insertion loss of the additional circuit 30 is minimum, (the ripple of) the return loss in the view from the node N1 (common terminal 100) to the additional circuit 30 may be made even lower than (the ripple of) the return loss in the view from the node N2 to the additional circuit 30. The adjacent loss to the filter 20 may thus be reduced, and an increase of the insertion loss of the filter 20 may be reduced more.

5. Advantageous Effects and Others

As described above, the multiplexer 1 according to an example of an example embodiment of the present invention includes the common terminal 100, the input/output terminals 110 and 120, the filter 10 connected between the common terminal 100 and the input/output terminal 110 and having the pass band including the first frequency band, the filter 20 connected between the common terminal 100 and the input/output terminal 120 and having the pass band including the second frequency band lower than the first frequency band, and the additional circuit 30 including the first end connected to the common terminal 100 and the second end connected to a portion of the path connecting the common terminal 100 and the input/output terminal 110, the portion excluding the common terminal 100. The additional circuit 30 includes the resonator including the plurality of IDT electrodes on the piezoelectric substrate, and one of the IDT electrodes that has the widest electrode finger pitch of the plurality of IDT electrodes is connected to the common terminal 100.

At the frequency at which the insertion loss of the additional circuit 30 is minimum, the return loss in the view from the common terminal 100 to the additional circuit 30 is thus lower than the return loss in the view from the node N2 to the additional circuit 30. The adjacent loss to the filter 20 is thus reduced, and thus the insertion loss deterioration in the filter 20 may be reduced. The multiplexer 1 including the filters 10 and 20 having the improved bandpass characteristic may thus be provided.

For example, in the multiplexer 1, the smallest value of the electrode finger pitch of the IDT electrode connected to the common terminal 100 is wider than the smallest value of the electrode finger pitches of the IDT electrodes excluding the IDT electrode connected to the common terminal 100.

Near the frequency at which the insertion loss of the additional circuit 30 is minimum, (the ripple of) the return loss in the view from the common terminal 100 to the additional circuit 30 may thereby be even lower than (the ripple of) the return loss in the view from the node N2 to the additional circuit 30. The adjacent loss to the filter 20 may thus be reduced more, and an increase of the insertion loss of the filter 20 may be reduced more.

For example, in the multiplexer 1, at the frequency at which the insertion loss of the additional circuit 30 is minimum, the return loss in the view from the common terminal 100 to the additional circuit 30 is lower than the return loss in the view from the node N2 to the additional circuit 30.

For example, in the multiplexer 1, the frequency at which the insertion loss of the additional circuit 30 is minimum is lower than a lower frequency end of the first frequency band.

The attenuation characteristic of the filter 10 thus is improved in the pass band lower than the pass band of the filter 10 (first frequency band), and the bandpass characteristic of the filter 20 may be improved.

For example, in the multiplexer 1, the first frequency band is the uplink operation band, and the second frequency band is the downlink operation band.

The bandpass characteristic of the filter 20 is thus improved, and thus reception sensitivity deterioration may be reduced.

OTHER MODIFICATIONS AND OTHERS

Multiplexers have heretofore been described with references to example embodiments of the present invention. However, acoustic wave filters of the present invention are not limited to the example embodiments described above. Other example embodiments implemented by combining any components in the example embodiments described above, modifications obtained by applying, to the example embodiments described above, modifications conceived of by those skilled in the art without departing from the spirit of the present invention, and various types of equipment including the multiplexers according to the example embodiments described above included therein are also included in the present invention.

For example, in the multiplexers, an inductor or a capacitor may be connected between components. The inductor may include a wiring inductor made of wiring connecting the components.

Example embodiments of the present invention and combinations, modifications, and variations thereof may be widely used for communications equipment such as mobile phones, as multiplexers each with low loss and high attenuation applicable to a frequency standard for multiband and multimode.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
a common terminal;
a first input/output terminal;
a second input/output terminal;
a first filter circuit connected between the common terminal and the first input/output terminal and having a pass band including a first frequency band;
a second filter circuit connected between the common terminal and the second input/output terminal and having a pass band including a second frequency band lower than the first frequency band; and
an additional circuit including a first end connected to the common terminal and a second end connected to a portion of a path connecting the common terminal and the first input/output terminal, the portion excluding the common terminal; wherein
the additional circuit includes a resonator including a plurality of interdigital transducer electrodes on a piezoelectric substrate; and
an interdigital transducer electrode of the plurality of interdigital transducer electrodes that has a widest electrode finger pitch is connected to the common terminal.

2. The multiplexer according to claim 1, wherein a smallest value of the electrode finger pitch of the interdigital transducer electrode connected to the common terminal is larger than a smallest value of an electrode finger pitch of an interdigital transducer electrode included in the plurality of interdigital transducer electrodes and excluding the interdigital transducer electrode connected to the common terminal.

3. The multiplexer according to claim 1, wherein at a frequency at which an insertion loss of the additional circuit is minimum, a return loss in a view from the first end to the additional circuit is lower than a return loss in a view from the second end to the additional circuit.

4. The multiplexer according to claim 1, wherein a frequency at which an insertion loss of the additional circuit is minimum is lower than a lower frequency end of the first frequency band.

5. The multiplexer according to claim 1, wherein
the first frequency band is an uplink operation band; and
the second frequency band is a downlink operation band.

6. The multiplexer according to claim 1, further comprising at least one impedance matching circuit element including an inductor.

7. The multiplexer according to claim 1, further comprising at least two inductors defining impedance matching circuit elements.

8. The multiplexer according to claim 1, further comprising reflectors on both sides of the resonator.

9. The multiplexer according to claim 1, wherein the resonator is a transversal acoustic wave resonator.

10. The multiplexer according to claim 1, wherein the widest electrode finger pitch is about ½ of a wavelength of the resonator.

11. The multiplexer according to claim 1, wherein the resonator is a longitudinally coupled resonator including a plurality of acoustic wave resonators.

12. The multiplexer according to claim 1, wherein the first filter circuit is a ladder acoustic wave filter circuit including a plurality of acoustic wave resonators.

13. The multiplexer according to claim 1, wherein the first filter circuit includes serial arm resonators and parallel arm resonators.

14. The multiplexer according to claim 1, wherein the second filter circuit is a longitudinally coupled resonator including a plurality of acoustic wave resonators.

15. The multiplexer according to claim 1, wherein the second filter circuit includes serial arm resonators and parallel arm resonators.

16. The multiplexer according to claim 1, wherein the piezoelectric substrate includes a high-acoustic-velocity support substrate, a low-acoustic-velocity film, and a piezoelectric film are stacked in this order.

17. The multiplexer according to claim 1, wherein the piezoelectric substrate includes a support substrate, an energy-confinement layer, and a piezoelectric film are stacked in this order.

18. The multiplexer according to claim 1, wherein the first filter circuit includes an inductor and a capacitor.

19. The multiplexer according to claim 1, wherein the second filter circuit is a bulk acoustic wave filter.

20. The multiplexer according to claim 1, wherein the second filter circuit is an LC filter.

\* \* \* \* \*